(12) United States Patent
Jeon et al.

(10) Patent No.: US 10,811,514 B2
(45) Date of Patent: Oct. 20, 2020

(54) ELECTRONIC DEVICE INCLUDING AN ENHANCEMENT-MODE HEMT AND A METHOD OF USING THE SAME

(71) Applicant: Semiconductor Components Industries, LLC, Phoenix, AZ (US)

(72) Inventors: Woochul Jeon, Scottsdale, AZ (US); Balaji Padmanabhan, Chandler, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/287,400

(22) Filed: Feb. 27, 2019

(65) Prior Publication Data

US 2019/0305123 A1 Oct. 3, 2019

Related U.S. Application Data

(60) Provisional application No. 62/649,249, filed on Mar. 28, 2018.

(51) Int. Cl.
*H01L 29/66* (2006.01)
*H01L 29/778* (2006.01)
(Continued)

(52) U.S. Cl.
CPC .... *H01L 29/66484* (2013.01); *H01L 27/0605* (2013.01); *H01L 29/2003* (2013.01);
(Continued)

(58) Field of Classification Search
CPC ......... H01L 29/66431; H01L 29/66439; H01L 29/66462; H01L 29/66469;
(Continued)

(56) References Cited

U.S. PATENT DOCUMENTS 8,587,033 B1 * 11/2013 Rieger .................. H01L 29/778
257/195
9,306,014 B1 * 4/2016 Kudymov ............. H01L 29/404
(Continued)

OTHER PUBLICATIONS

M. Uchida et al., "Novel SiC Power Mosfet with Integrated Unipolar Internal Inverse OS-Channel Diode", IEEE Explore, 2011.
(Continued)

*Primary Examiner* — Eduardo A Rodela
(74) *Attorney, Agent, or Firm* — Abel Schillinger, LLP (57) ABSTRACT

An electronic device can include an enhancement-mode high electron mobility transistor (HEMT) that includes a source electrode; a drain electrode; and a gate. In an embodiment, the gate can correspond to spaced-apart gate electrodes and a space disposed between the spaced-apart gate electrodes, wherein the first space has a width configured such that, a continuous depletion region forms across all of the width of the first space. In another embodiment, the gate can be a gate electrode having a nonuniform thickness along a line in a gate width direction. In another aspect, a method of using the electronic device can include, during a transient period when the HEMT is in an off-state, flowing current from the drain electrode to the source electrode when Vds>−Vth+Vgs.

20 Claims, 5 Drawing Sheets

(51) Int. Cl.
*H01L 29/20* (2006.01)
*H03K 17/687* (2006.01)
*H01L 29/423* (2006.01)
*H01L 27/06* (2006.01)
*H01L 29/205* (2006.01)

(52) U.S. Cl.
CPC ...... *H01L 29/205* (2013.01); *H01L 29/42316* (2013.01); *H01L 29/66431* (2013.01); *H01L 29/66462* (2013.01); *H01L 29/66477* (2013.01); *H01L 29/778* (2013.01); *H01L 29/7786* (2013.01); *H01L 29/7787* (2013.01); *H03K 17/687* (2013.01)

(58) Field of Classification Search
CPC ......... H01L 29/66477; H01L 29/66484; H01L 29/778; H01L 29/7781; H01L 29/7782; H01L 29/7786; H01L 2924/13064
See application file for complete search history.

(56) References Cited

U.S. PATENT DOCUMENTS

| | | | | |
|---|---|---|---|---|
| 10,103,239 | B1* | 10/2018 | Chou | H01L 29/42316 |
| 2006/0049454 | A1 | 3/2006 | Thapar | |
| 2009/0032820 | A1* | 2/2009 | Chen | H01L 29/402 |
| | | | | 257/76 |
| 2013/0032860 | A1* | 2/2013 | Marino | H01L 29/66462 |
| | | | | 257/194 |
| 2013/0161698 | A1* | 6/2013 | Marino | H01L 29/42316 |
| | | | | 257/194 |
| 2014/0021511 | A1 | 1/2014 | Jeon et al. | |
| 2014/0021514 | A1 | 1/2014 | Jeon et al. | |
| 2014/0077268 | A1* | 3/2014 | Darwish | H01L 29/737 |
| | | | | 257/197 |
| 2014/0110723 | A1 | 4/2014 | Ikegami et al. | |
| 2014/0151749 | A1 | 6/2014 | Jeon et al. | |
| 2014/0327011 | A1* | 11/2014 | Pendharkar | H01L 29/778 |
| | | | | 257/76 |
| 2015/0155377 | A1* | 6/2015 | Kim | H01L 29/7786 |
| | | | | 257/194 |
| 2015/0179732 | A1* | 6/2015 | Marino | H01L 29/42384 |
| | | | | 257/401 |
| 2015/0255547 | A1* | 9/2015 | Yuan | H01L 29/7788 |
| | | | | 257/76 |
| 2015/0270382 | A1* | 9/2015 | Khan | H01L 29/66484 |
| | | | | 257/194 |
| 2016/0111505 | A1* | 4/2016 | Simin | H01L 29/408 |
| | | | | 257/192 |
| 2016/0336313 | A1 | 11/2016 | Jeon et al. | |
| 2017/0186860 | A1* | 6/2017 | Wong | H01L 29/7786 |
| 2017/0294530 | A1 | 10/2017 | Moens et al. | |

OTHER PUBLICATIONS

Rambir Singh et al., "Development of High-Current 4H-SiC ACCUFET", IEEE Transactions on Electron Devices, vol. 50, No. 2, Feb. 2003.

\* cited by examiner

ELECTRONIC DEVICE INCLUDING AN ENHANCEMENT-MODE HEMT AND A METHOD OF USING THE SAME

CROSS REFERENCE TO RELATED APPLICATION

This application claims priority under 35 U.S.C. § 119(e) to U.S. Patent Application No. 62/649,249 entitled "Electronic Device Including an Enhancement-Mode HEMT and a Method of Using the Same," by Padmanabhan and Jeon, filed Mar. 28, 2018, which is assigned to the current assignee hereof and incorporated herein by reference in its entirety.

FIELD OF THE DISCLOSURE

The present disclosure relates to electronic devices, and more particularly to, electronic devices including an enhancement-mode high electron mobility transistor and methods of using the same.

RELATED ART

For many transistors, particularly power transistors, electrons flow from the source to the drain when the transistor is in an on-state. A high-side transistor can be coupled to a low-side transistor, and during a switching operation, reverse conduction may be used to dissipate a voltage overshoot at an output node when the high-side transistor is turned off. Thus, electrons flow from the drain to the source of the transistor. In silicon metal-oxide-semiconductor field-effect transistor ("Si MOSFET"), the voltage overshoot may be dissipated by a pn junction diode breakdown. A high electron mobility transistor does not have a pn junction similar to the Si MOSFET, and thus, novel structures and methods are desired to address a voltage overshoot situation without causing a further complication.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, "length" of a region, electrode, or other structural feature is measured in a direction of current flow when in an on-state, and "width" is of a region, electrode, or other structural feature is measured in a direction orthogonal to current flow when in an on-state.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The term "power transistor" is intended to mean a transistor that is designed to normally operate with at least a 30 V difference maintained between the source and drain of the transistor or emitter and collector of the transistor when the transistor is in an off-state. For example, when the transistor is in an off-state, a 30 V may be maintained between the source and drain without a junction breakdown or other undesired condition occurring.

The term "semiconductor base material" refers to the principal material within a semiconductor substrate, region, or layer, and does not refer to any dopant within the semiconductor substrate, region, or layer. A B-doped Si layer has Si as the semiconductor base material, and a C-doped GaN layer has GaN as the semiconductor base material.

The term "steady state" refers to a state in which operation of a circuit or a component within a circuit does not significantly change with time. The term "transient state" refers to a state in which operation of a circuit or a component within a circuit significantly changes with time. For example, a voltage at a node within the circuit may be fluctuating such that voltage swings decrease in amplitude over time, and may be referred to as ringing. After a period of time, the voltage swing becomes insignificant because that amplitude of the voltage swing is a small fraction of the initial amplitude. Thus, the circuit can be in a transient state during ringing and can be at steady state once the ringing becomes insignificant.

For a transistor, Vds is the drain-to-source voltage, Vgs is the gate-to-source voltage, and Vth is the threshold voltage.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive- or and not to an exclusive- or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An enhancement-mode high electron mobility transistor (HEMT) can be configured to better allow reverse conduction with significantly less power dissipation compared to a conventional design. In an embodiment, a gate of the HEMT can include spaced apart gate electrodes with a space between the gate electrodes. The width of the space can be designed so that a depletion region is continuous across the space while the HEMT is in the off-state, and reverse conduction occurs along a heterojunction below the space before reverse conduction occurs along the heterojunction below the gate electrodes. Such a design can reduce the area of reverse conduction, and thus, reduce the current and power during reverse conduction. In another embodiment, the thickness of the gate electrode can be nonuniform to achieve a reduction in current and power during reverse conduction.

In a further embodiment, another component can be added that has its current-carrying electrodes connected to the source and drain of the HEMT. In a particular embodiment, the other component may be smaller as compared to the transistor structure(s) that make up the HEMT. The other component can be a transistor having its source and gate electrically connected to each other to form a barrier diode. In a particular embodiment, the other component can be an enhancement-mode or a depletion-mode HEMT. Reverse conduction may preferentially occur with the other component, as compared to the HEMT, particularly when the HEMT in the off-state has Vgs less than 0 V. Similar to the other embodiments, the other component embodiments can be useful to reduce current and power during reverse conduction, as compared to the HEMT without the other component.

The concepts are better understood with respect to the description below and figures. In many of the top views of transistor structures, drain, gate, and source electrodes are illustrated, and gate interconnects are not illustrated to simplify understanding of the positional relationships between the drain, gate, and source electrodes.

Figure 1:
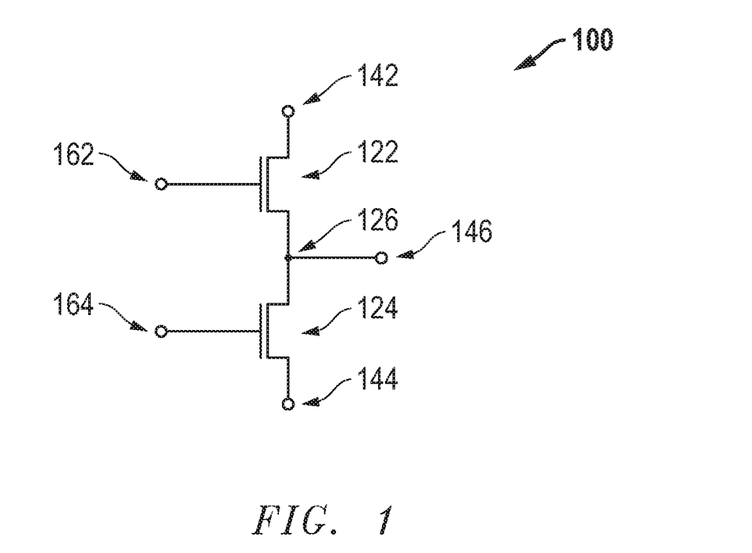
FIG. 1 includes a depiction of a switching circuit that includes a pair of switching transistors.

FIG. 1 includes a schematic diagram of a circuit 100 that includes a high-side transistor 122 and a low-side transistor 124. A drain of the high-side transistor 122 is coupled to a drain terminal 142 of the circuit 100, and a source of the low-side transistor 124 is coupled to a source terminal 144 of the circuit 100. A source of the high-side transistor 122 and a drain of the low-side transistor 124 are coupled to each other at an output node 126 that is connected to an output terminal 146 of the circuit 100. Gates of the transistors 122 and 124 are coupled to control terminals 162 and 164, respectively.

In an embodiment, each of the transistors 122 and 124 is a HEMT. Control circuitry (not illustrated) is designed so that a signal to turn on a transistor in the circuit 100 is supplied to only one of the transistors 122 and 124 at a time. Both transistors 122 and 124 are not to be turned on at the same time. The circuit 100 is useful in an energy converter, such a buck converter, voltage regulator, or the like. Both the transistors 122 and 124 are illustrated as enhancement-mode transistors. In another embodiment, the high-side transistor 122 can be a depletion mode transistor.

During operation, the high-side transistor 122 can be in an on-state, and the low-side transistor 124 can be in an off-state. At a later point in time, the high-side transistor 122 can be turned off while the low-side transistor 124 remains in the off-state. During a transient period of time, the voltage swing at the output node 126 can be significant. The voltage swing can be referred to as ringing. A HEMT does not have a pn junction diode that is present in a Si MOSFET. Thus, the low-side transistor 124 or another component can be added to allow for reverse conduction.

The low-side transistor 124 can have a threshold voltage (Vth) in a range of 1 V to 3 V. In a particular embodiment, Vth is 2 V. When the high-side transistor 122 is turned off, the voltage at the node 126 can become negative, and thus, the Vds of the low-side transistor can become negative. In such a condition, reverse conduction (electrons flowing from the drain to the source) may be desired to reduce charge at the node 126. Reverse conduction can occur when Vds<−Vth+Vgs.

Figure 2:
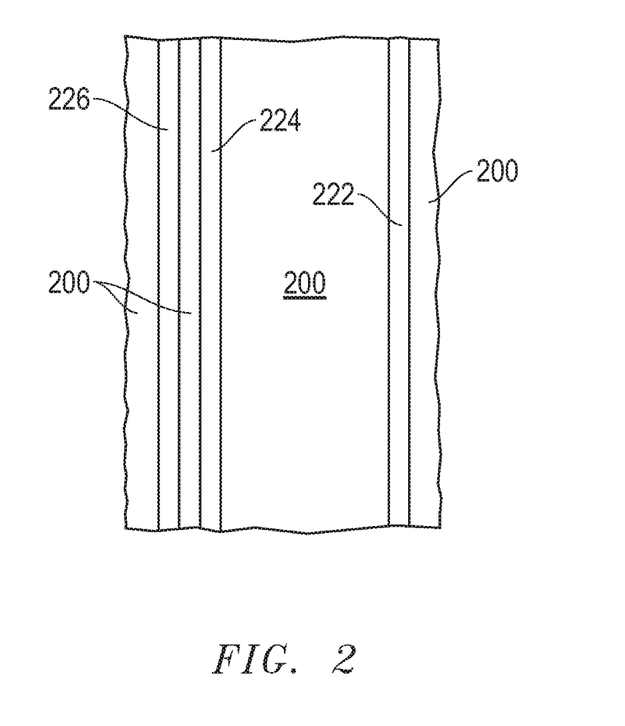
FIG. 2 includes an illustration of a top view of a portion of a workpiece including a transistor structure.

FIG. 2 includes a top view of a layout that can be used for the high-side transistor 122, the low-side transistor 124, or both transistors. As illustrated, a source electrode 226, a gate electrode 224, and a drain electrode 222 extend continuously from the top to the bottom of FIG. 2. An interlevel dielectric (ILD) layer 200 lies between the electrodes. Issues with the layout in FIG. 2 are better understood with an example. At the beginning of the example, the circuit 100 in FIG. 1 is operating in a steady state with the high-side transistor 122 in the on-state, and the low-side transistor 124 in the off-state. Control circuitry (not illustrated) turns off the high-side transistor 122 by sending an appropriate signal to the gate terminal 162. The low-side transistor 124 remains in an off-state during the switching operation. During a transient state after turning off the high-side transistor 122, the voltage on the node 146 can vary, and thus, the voltage on the drain electrode 222 also varies, and Vds for the low-side transistor 124 may become negative (the voltage on the source electrode 226 can become higher than the voltage of the drain electrode 222).

In one mode of operation, the gate electrode 224 and the source electrode 226 are at substantially the same voltage (Vgs=0 V) when in the off-state. For example, control circuitry (not illustrated) can place the gate terminal 164 and the source terminal 144 at the same voltage. After the previously described switching operation occurs and Vgs of the low-side transistor 124 is 0 V, the voltage on the drain electrode (Vds) of the low-side transistor 124 becomes lower than −Vth for the low-side transistor 124 (Vds<−2 V), the low-side transistor 124 can turn on in a reverse conduction mode (electron flow is the reverse as compared to when the low-side transistor 124 is in an on-state). Thus, electrons can flow from the drain electrode 222 to the source electrode 226 during voltage overshoot. If the current flowing through the low-side transistor 124 reaches 1 A during reverse conduction, the power to be dissipated during the voltage overshoot can be 2 W when Vgs=0 V and Vth=2 V.

In order to reduce gate bounce, in another mode of operation, Vgs can be lowered, such as to −5 V. The control circuitry can place the gate terminal 164 at −5 V and the source terminal at 0 V. Reverse conduction occurs when Vds is lower than −Vth+Vgs, or −2 V+(−5 V), or lower than −7 V. During reverse conduction, if the current flowing through the low-side transistor 124 reaches 1 A, the power to be dissipated during overshoot can be 7 W. Thus, reducing the likelihood of gate bounce may be accompanied by more power that needs to be dissipated and lost.

Figure 3:
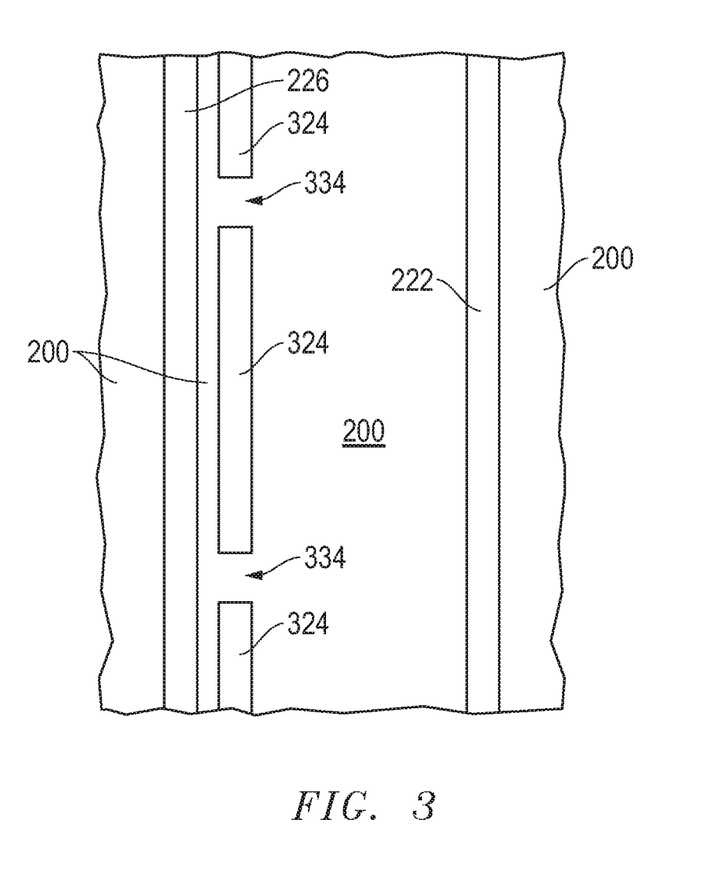
FIG. 3 includes an illustration of a top view of a portion of a workpiece including a transistor structure having spaced-apart gate electrodes.

The inventors have discovered a transistor structure that can allow for lower power dissipation during reverse conduction. FIG. 3 illustrates a top view of a transistor structure that includes the source electrode 226, the drain electrode 222, and a gate that includes spaced-apart gate electrodes 324 separated by spaces 334. A gate interconnect (not illustrated in FIG. 3) contacts the spaced-apart gate electrodes 324, so that the spaced-apart gate electrodes 324 are electrically connected to one another. The spaced-apart gate electrodes 324 are coupled to the gate terminal 164 (FIG. 1) via the gate interconnect. The widths of the spaces 334 are addressed with respect to FIG. 4. In an on-state, Vgs for the low-side transistor 124 can be at least as high as the threshold voltage, such as 2 V to 3 V, and electrons can flow from the source electrode 226, under the spaced-apart gate electrodes 324, and to the drain electrode 222.

Figure 4:
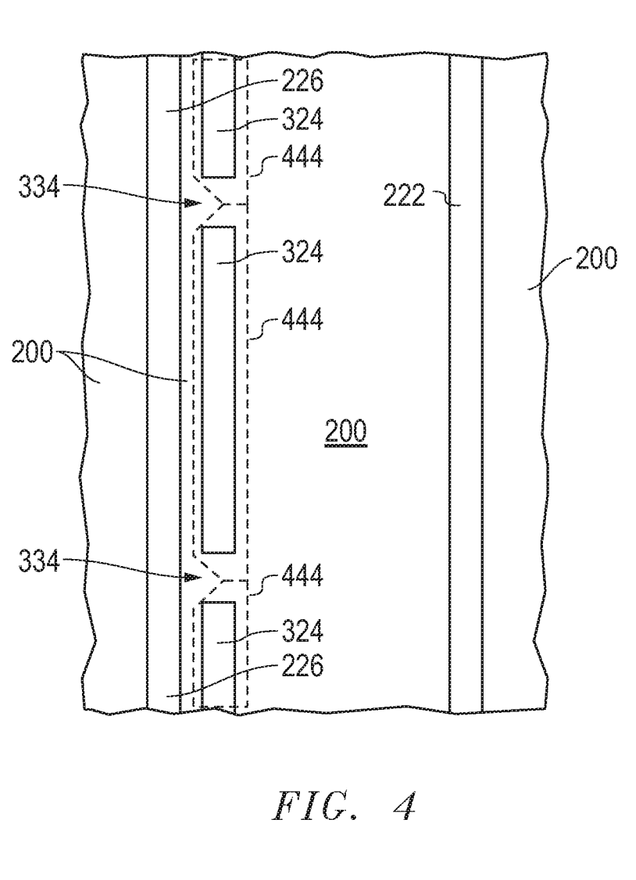
FIG. 4 includes an illustration of a top view of the workpiece of FIG. 3 illustrating a depletion region when in an off-state.

FIG. 4 illustrates a top view of the transistor structure in FIG. 3, when the transistor structure is at steady state in the off-state. When in the off-state, the gate may be biased to reduce gate bounce, so Vgs is negative, for example, in a range of −0.5 V to −9 V. The widths of the spaces 334 are selected so that a continuous depletion region 444 forms across the widths of the gate electrodes 324 and all of the widths of the spaces 334 as illustrated in FIG. 3. Although the depletion region 444 is illustrated as being continuous, the length of the depletion region 444 is smaller in the spaces 334 as compared to the space-apart gate electrodes 424. Note that length is measured in the direction of current flow, and width is measured in a direction perpendicular to the length, which is in a direction between the top and bottom of FIGS. 2 to 4.

Referring to FIG. 1, the circuit 100 may be operating with the high-side transistor 122 in the on-state and the low-side transistor 124 in the off-state. The voltage at the output node 126 is substantially the same as the voltage on the drain terminal 142. At a later point in time, the high-transistor 122 is turned off while the low-side transistor 124 remains in the off-state. Immediately after turning off the high-side transistor 124, the voltage at the output node 126 can swing causes ringing. The ringing can occur during a transient state, and the Vds for the low-side transistor 124 can become negative. If a continuous gate electrode without spaces is used, such as illustrated in FIG. 2, reverse conduction occurs when Vds<−Vth+Vgs. However, the presence of the spaces allows reverse conduction to occur at a higher voltage, meaning closer to 0 V. Thus, reverse conduction can occur when Vds>−Vth+Vgs.

A non-limiting example may help in understanding the significance. In this example, Vth is 2 V and Vgs in the off-state is −5 V. For a continuous gate electrode (no spaces), Vds needed for reverse conduction can be −7 V and lower. With the spaces 334, Vds can be higher (closer to 0 V) and still achieve reverse conduction. As Vds becomes negative, the depletion region 444 can become smaller and then become discontinuous within the spaces 334. When the depletion region 444 becomes discontinuous, reverse conduction can occur. For example, when Vds is at −2 V, reverse conduction may occur even when Vgs is at −5 V. Further, the path of current flow during reverse conduction can be restricted to the spaces 334 when Vds>−Vth+Vgs.

The power dissipated during the voltage overshoot can be significantly less than in the situation addressed in FIG. 2. The portion of the channel width of the transistor structure in FIG. 3 associated with the spaces 334 can be at most 50%, at most 30%, or at most 9% of the channel width. For example, if the spaces 334 make up 9% of the channel width and reverse conduction occurs when Vds is −2 V, the power dissipated is approximately 9% of the power dissipated by the transistor structure of FIG. 2 when Vth is 2 V and Vgs is 0 V. As Vgs becomes more negative, the fraction dissipated with the spaced-apart gate electrodes 324 becomes even smaller when comparing the transistor structures in FIGS. 2 and 3.

If the any of the spaces 334 is too wide, a continuous depletion region may not be formed along the width of the spaces 334, and leakage current may be unacceptably high. Simulations can be performed to determine the width of the spaces for different Vths and Vgss. In an embodiment, each of the widths of the spaces 334 can be less than 0.50 microns, and may be at most 0.45 microns, or at most 0.40 micron. In another embodiment, the spaces 334 can have widths of at least 0.01 micron. In a particular embodiment, the widths of the spaces 334 can be in a range from 0.1 micron to 0.4 microns.

Figure 5:
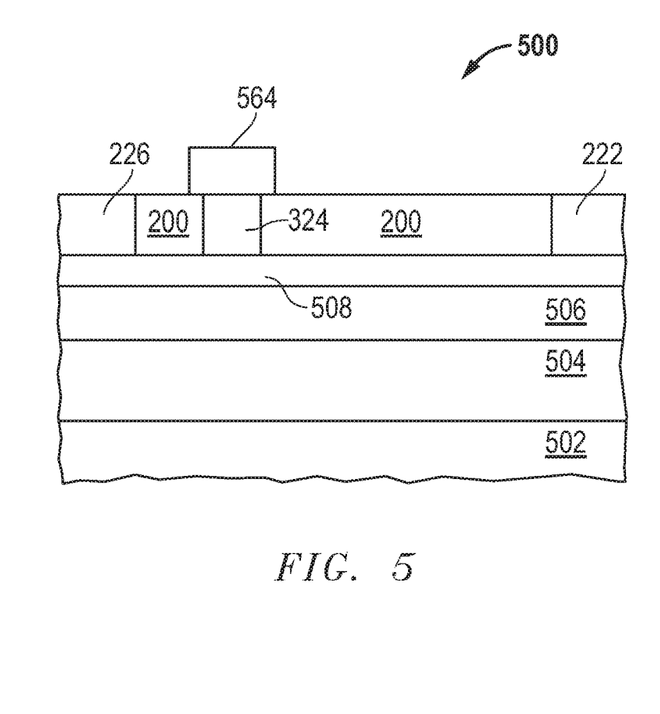
FIG. 5 includes an illustration of a cross-sectional view of the workpiece of FIG. 2 or 3.

FIG. 5 includes a cross-sectional view of a transistor structure 500 that can be used for the high-side transistor 122, low-side transistor 124, or another transistor. The transistor structure 500 is well suited for a HEMT and an enhancement-mode HEMT in particular. The structure 500 can include a substrate 502, buffer layer 504, a channel layer 506, and a barrier layer 508. The substrate 502 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the semiconductor stack that will be subsequently formed over the substrate 502.

Each of the layers 504, 506, and 508 can include a III-N material, and in a particular embodiment include $Al_xGa_{(1-x)}N$, where $0 \le x \le 1$. The composition of the buffer layer 504 may depend on the composition of the channel layer 506. The composition of the buffer layer 504 can be changed as a function of thickness, such that the buffer layer 504 has a relatively greater aluminum content closer to the substrate 502 and relatively greater gallium content closer to the channel layer 506. In a particular embodiment, the cation (metal atoms) content in the buffer layer 504 near the substrate 502 can be 10 atomic % to 100 atomic % Al with the remainder Ga, and the cation content in the buffer layer 504 near the channel layer 506 can be 0 atomic % to 50 atomic % Al with the remainder Ga. The buffer layer 504 can have a thickness in a range of approximately 1 micron to 5 microns.

The channel layer 506 can include $Al_yGa_{(1-y)}N$, where $0 \le y \le 0.1$ and have a thickness in a range of approximately 20 nm to 4000 nm. The channel layer 506 can include GaN, such as undoped or unintentionally doped GaN (dopant concentration is at most $5 \times 10^{16}$ atoms/cm$^3$). In another embodiment, the channel layer 506 is a GaN layer that may be doped with an electron donor (n-type) dopant or an electron acceptor (p-type) dopant.

The barrier layer 508 can be used to help reduce the likelihood of migration of contaminants or other materials and forms a heterojunction between the layers 506 and 508. In an embodiment, the barrier layer 508 includes a III-V material. In a particular embodiment, the barrier layer 508 can include $Al_zGa_{(1-z)}N$, wherein $0.02 \le z \le 0.5$, and in a further embodiment $0.05 \le z \le 0.3$. The barrier layer 508 can have a thickness in a range of approximately 2 to 30 nm.

The layers 506 and barrier layer 508, and at least a portion of the buffer layer 504 can be formed using an epitaxial growth technique, and thus, can be monocrystalline. In a particular embodiment, metal-containing films can be formed using metalorganic chemical vapor deposition. In another embodiment, a different composition for any one or more of layers 504, 506, and 508 may be used, e.g., InAlGaN, InP, or the like.

The spaced-apart gate electrodes 324 overlie the barrier layer 508. The spaced-apart gate electrodes 324 can include a p-type semiconductor material. In an embodiment, the p-type semiconductor material can include p-type doped $Al_cGa_{(1-c)}N$ wherein $0 \le c \le 1$. In a particular embodiment, the p-type semiconductor material is p-type GaN (c=0). The p-type dopant can include Mg, Zn, Cd, or the like. The p-type semiconductor material can be monocrystalline or polycrystalline. The dopant concentration within the spaced-apart gate electrodes 324 can be higher as the distance from the barrier layer 508 increases. The average dopant concentration within the spaced-apart gate electrodes 324 is at least $1 \times 10^{18}$ atoms/cm$^3$. In another embodiment, the average dopant concentration is at most $1 \times 10^{21}$ atoms/cm$^3$. The layer for the spaced-apart gate electrodes 324 can be formed using any of the techniques that can be used in forming the channel layer 506 or the barrier layer 508. The p-type dopant can be incorporated in-situ or introduced into the gate electrode layer after deposition. The gate electrodes 324 can have a thickness in a range from 20 nm to 300 nm.

A two-dimensional electron gas (2DEG) 520 is along an interface between the channel and barrier layers 506 and 508 except under the depletion region 444, including the spaced-apart gate electrodes 324. Thus, the transistor structure is an enhancement-mode HEMT.

The transistor structure 500 further includes the ILD 200, the source electrode 226, the spaced-apart gate electrodes 324, and the drain 222. A gate interconnect 564 contacts the spaced-apart gate electrodes 324 and is spaced apart from the barrier layer 508 by the spaced-apart gate electrodes 324 and the ILD layer 200 within the spaces 334 between the spaced-apart gate electrodes 324. When the transistor structure 500 corresponds to the low-side transistor 124 in FIG. 1, the drain electrode 222 is coupled to the node 146, the gate interconnect 564 is coupled to the gate terminal 164, and the source electrode 226 is coupled to the source terminal 144.

The ILD layer 200 can include one or more films of oxide, nitride, or oxynitride. The ILD layer 200 is patterned to define contact openings for the source electrode 226, the gate interconnect 564, and the drain electrode 222. The source electrode 226, the gate interconnect 564, and the drain electrode 222 may be formed from the same or different conductive layers. The conductive layer can include one or more films including Ti, TiN, Al, Cu, Pd, Pt, W, Au, Ni, or a stack or any combination thereof. In another embodiment, the conductive layer is typically at least 70 wt. % aluminum or copper, a noble metal, or an alloy of any of the foregoing.

In another embodiment, the combination of the spaced-apart gate electrodes 324 and gate interconnect 564 can be replaced by a gate dielectric layer and a gate member, where the gate member includes gate electrode portions that extend to the gate dielectric layer, and a gate interconnect portion that overlie the gate electrode portions and insulating layer lying within the spaces 334. The gate electrode portions have shapes that corresponds to the spaced-apart gate electrodes 324, and the gate interconnect portion has a shape that corresponds to the gate interconnect 564. In this alternative embodiment, the gate member can include a conductive layer that has one or more conductive films, wherein the film closest to the barrier layer 508 may be selected for a desired work function.

Figure 6:
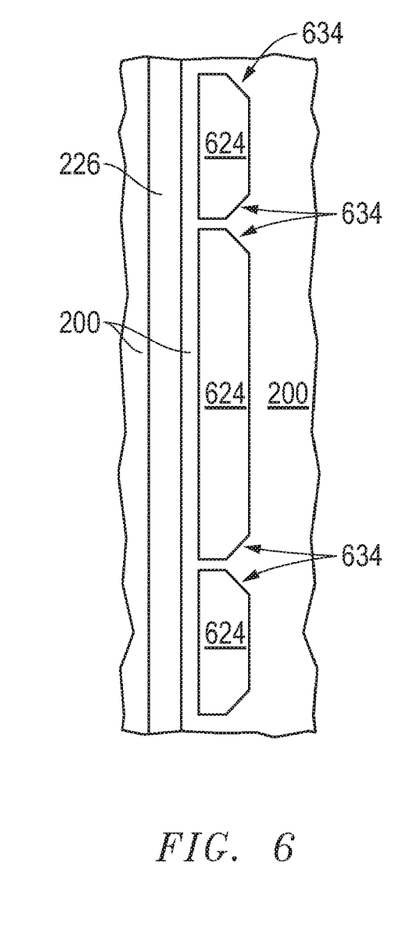
FIG. 6 includes an illustration of a top view of a portion of a workpiece including a transistor structure that includes spaced-apart gate electrodes with tapered corners.
Figure 7:
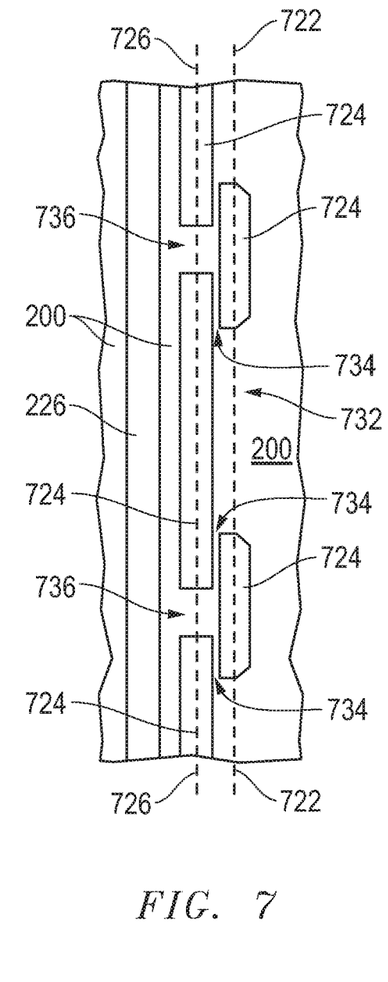
FIG. 7 includes an illustration of a top view of a portion of a workpiece including a transistor structure that includes spaced-apart gate electrodes arranged in different rows.

FIGS. 6 and 7 include top views of alternative layouts for the gate of the transistor structure 500. Each of FIGS. 6 and 7 includes the source electrode 226 and spaced-apart gate electrodes. Although not illustrated in FIGS. 6 and 7, the drain electrode 222 is to the right of the spaced-apart gate electrodes. In FIG. 6, spaced-apart gate electrodes 624 have tapered corners 634. The tapered corners 634 face the drain electrode 222. In another embodiment, the corners 634 may be rounded instead of tapered. In FIGS. 3, 4, and 6, the spaced-apart gate electrodes are oriented along a line that is substantially normal to current flow when the transistor structure is in the on-state. In FIG. 7, spaced-apart gate electrodes 724 are oriented along two lines, depicted with dashed line 726, which is closer to the source electrode 226, and dashed line 722, which is closer to the drain electrode 222. The lines can be substantially parallel to and spaced apart from each other. In an embodiment, the lines can be at most 9°, 5°, or 1° off from being completely parallel to each other. The spacings 732 of the gate electrodes 724 along dashed line 722 and spacings 736 of the gate electrodes 724 along dashed line 726 (in the width direction) can be relaxed because a continuous depletion region can be formed due to the spacings 734 between the gate electrodes 724 in the different rows (in the length direction). In this embodiment, the spacings 734 can have any of the values as previously described with respect to the spacings 334.

Figure 8:
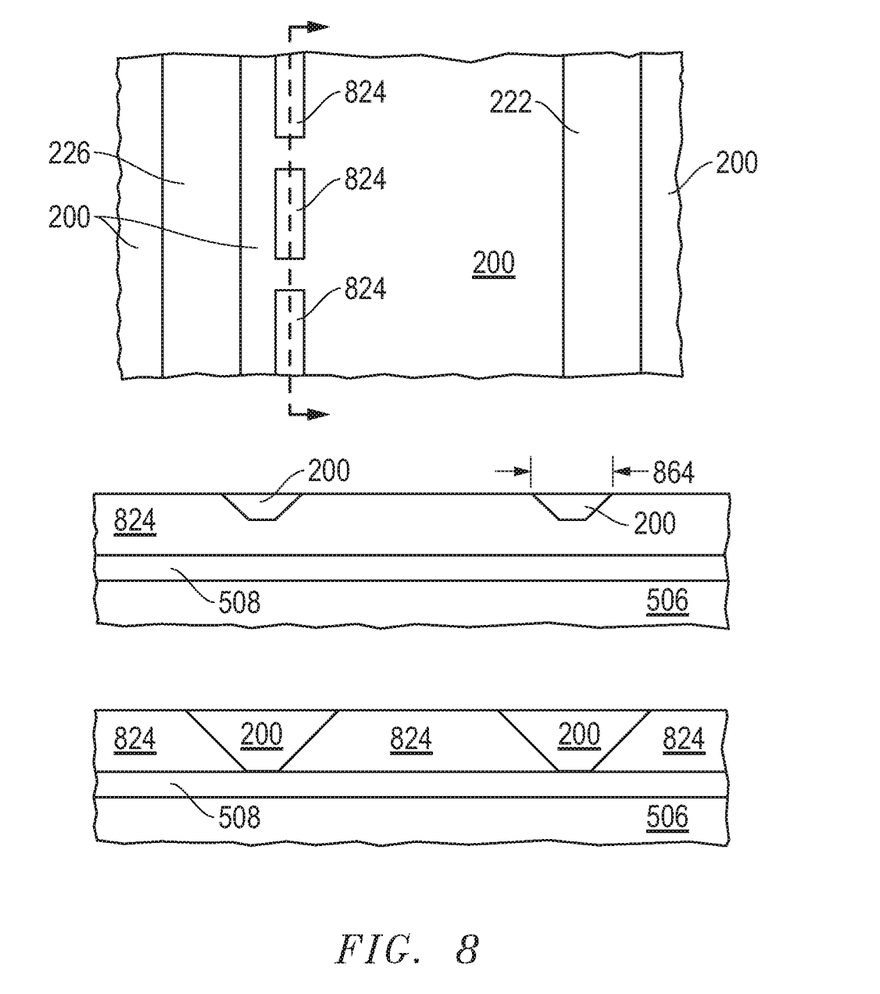
FIG. 8 includes illustrations of top and cross-sectional views of a portion of a workpiece including a transistor structure having a gate electrode layer that is partly or completely etched.

FIG. 8 includes a top view and a cross-sectional view of another embodiment in which a continuous gate electrode 824 is formed except the thickness varies along the width of the gate electrode (in a direction perpendicular to current flow through the transistor structure). As seen in the middle illustration of FIG. 8, a partial etch may be performed at location where spacings otherwise would occur, as illustrated in FIG. 3. In an embodiment, the p-type dopant concentration within the gate electrode 824 can be higher near the upper surface as compared to the lower surface that is closer to the barrier layer 508. The minimum thickness along the gate electrode 824 can be at most 80% of the thickness of the maximum thickness of the gate electrode 824. In an embodiment, the minimum thickness along the gate electrode can be at most 50%, at most 30%, or at most 10% of the thickness of the maximum thickness of the gate electrode 824. If the etch is continued, the gate electrodes can be spaced apart, as illustrated in the bottom illustration in FIG. 8 that can correspond to any of the layouts in FIGS. 3 to 7. The sides formed by the partial or complete etch can be tapered (as illustrated) or vertical (not illustrated). The widths 864 of the thinner portions 834, as measured along the uppermost surface of the gate electrode 824, can be any of the widths as described with respect to the spaces 334. In another embodiment, the widths 864 may be wider as the thickness of the thinner portions 834 increases. For example, the widths 864 may be up to 2 microns or wider when the minimum thickness along the gate electrode 824 is 80% of the thickness of the maximum thickness of the gate electrode 824.

Figure 9:
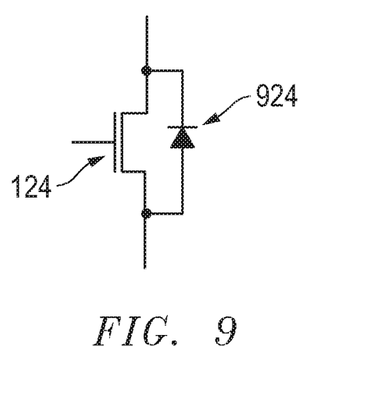
FIG. 9 includes an illustration of a circuit in which a transistor and a diode are connected in parallel, where reverse conduction can occur through the diode.

In another embodiment, another transistor structure can be used. FIG. 9 includes a circuit diagram of the transistor 124 and a diode 924. The diode 924 can have its anode and cathode connected the source and drain, respectively, of the transistor 124. In this embodiment, the low-side transistor 124 can have a single gate electrode between a pair of source and drain electrodes. In an embodiment, the transistor 124 can have a layout similar to the illustration in FIG. 2 and a structure as described with respect to FIG. 5 except the spaced-apart gate electrodes 324 are replaced by the gate electrode 224.

Figure 10:
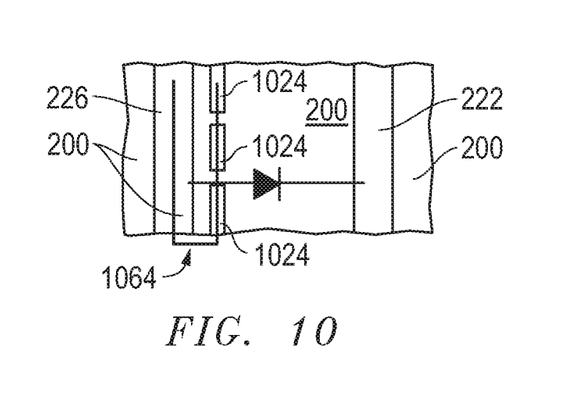
FIG. 10 includes an illustration of a top view of a structure that can be used as the diode in FIG. 9.

FIG. 10 includes a top view of the diode 924 having a transistor structure that is configured as a barrier diode, as its source and gate are electrically connected to each other. The transistor 124 and transistor structure for the diode 924 can be separate spaced-apart structures on the same die or may be integrated to share a common source electrode and a common drain electrode. In the embodiment of FIG. 10, the source electrode 226 is a common source electrode for the transistor 124 and the transistor structure of the diode 924, and the drain electrode 222 is the common drain electrode for the transistor 124 and the transistor structure of the diode 924.

The transistor structure for the diode 924 can include a gate interconnect 1064 that shorts spaced-apart gate electrodes 1024 and the source electrode 226 to one another. The gate electrodes 1024 are spaced apart by spacings 1034 that have a value as previously described with respect to the spacings 334. The transistor structure for the diode 924 can have a transistor structure that is smaller than the transistor structure for the low-side transistor 124. In particular, the channel width of the transistor structure for the diode 924 can be at most, 30%, at most 20%, or at most 9% of the channel width of the transistor structure for the transistor 124. In another embodiment (not illustrated), the spaced-apart gate electrodes 1024 and spacings 1034 can be replaced by a continuous gate electrode.

The gate of the transistor 124 can be controlled independently of the gate of the transistor structure for the diode 924. When in the off-state, the Vgs for the low-side transistor 124 can be less than 0 V; however, Vgs for the transistor structure of the diode 924 is 0 V because the source and gate electrodes of the transistor structure for the diode 924 are electrically shorted. In a particular example, reverse conduction for the diode 924 can occur when Vds is at or lower than −Vth for the transistor structure used for the diode 924, such as −2 V, whereas reverse conduction in the low-side transistor 124 at −7 V when the low-side transistor 124 is in an off-state with Vgs is −5 V and Vth is 2 V.

Figure 11:
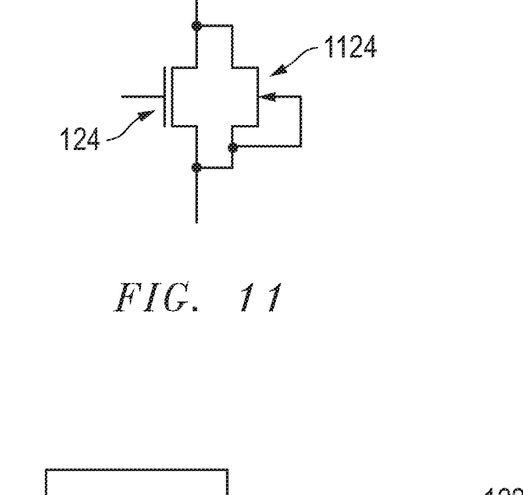
FIG. 11 includes an illustration of a circuit in which a first transistor and second transistor are connected in parallel, in which the second transistor has its source and gate electrically connected to each other.

In a further embodiment, another structure can be used. FIG. 11 includes a circuit diagram of the transistor 124 and another transistor 1124. The sources of the transistors 124 and 1124 and the gate of the transistor 1124 are electrically connected to each other, and the drains of the transistors 124 and 1124 are electrically connected to each other. The transistor 124 can have a layout similar to the illustration in FIG. 2 and a structure as described with respect to FIG. 5 except the spaced-apart gate electrodes 324 are replaced by the gate electrode 224.

Figures 12, 13:
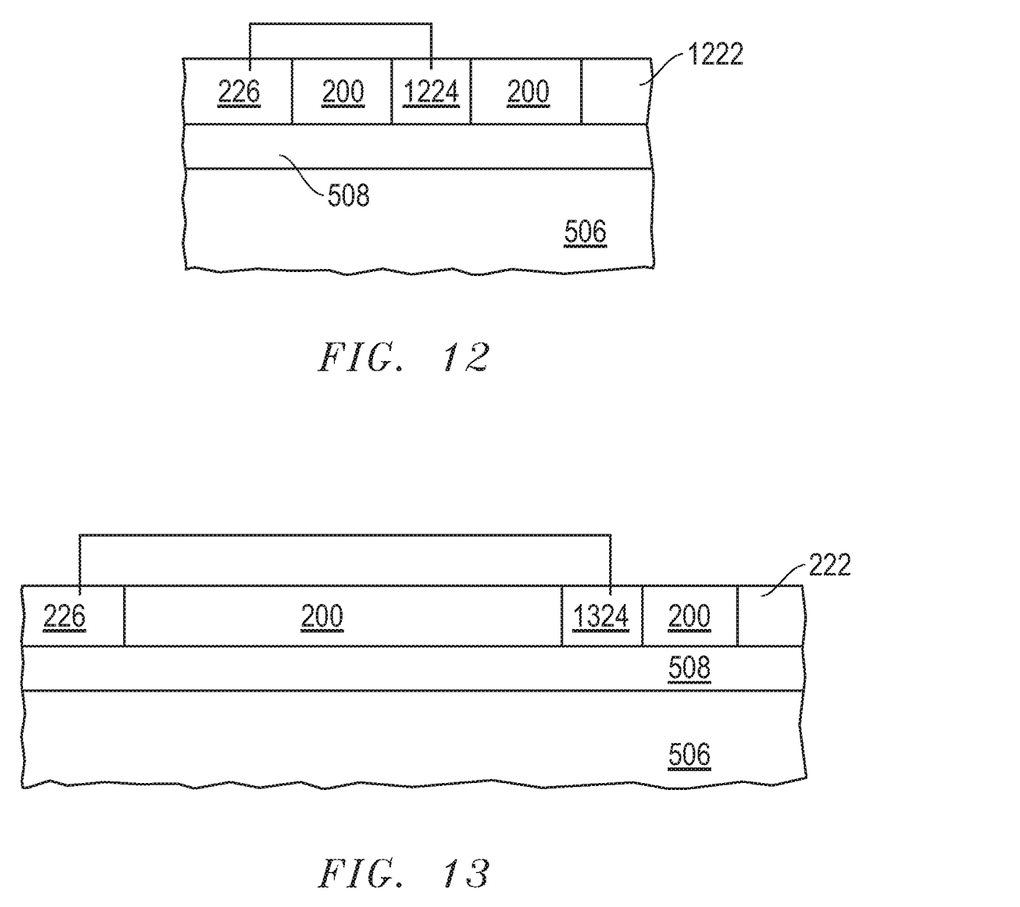
FIG. 12 includes an illustration of a cross-sectional view of a portion of a workpiece that includes a transistor structure that can be used as the second transistor in FIG. 11.
FIG. 13 includes an illustration of a cross-sectional view of a portion of a workpiece that includes another transistor structure that can be used as the second transistor in FIG. 11.

A variety of different transistor structures can be used for the other transistor 1124. In particular, the channel width of the transistor structure for the transistor 1124 can be at most, 50%, at most 20%, or at most 9% of the channel width of the transistor structure for the transistor 124. In an embodiment, the transistor 1124 can have a different gate structure as compared to the transistor 124. The gate structures for the transistor 1124 can be selected so that it has a Vth lower than the Vth of the transistor 124. For example, Vth of the transistor 124 may be 2 V, and Vth of the transistor 1124 may be 1 V or lower. The transistor 1124 can be an enhancement-mode transistor or a depletion-mode HEMT. The gate structure can be in the form of a Schottky contact between a metal gate electrode and the barrier layer, as illustrated in FIG. 12. In another embodiment, an insulating layer is disposed between a metal gate electrode and the barrier layer. In a further embodiment, the transistor structure for the transistor 1124 can have a gate electrode 1224 that includes a p-type III-V semiconductor material that is thinner than the gate electrode of the transistor 124. In a particular embodiment, the gate electrodes for the transistors 124 and 1124 can include the same material.

FIGS. 12 and 13 include transistor structures for the transistor 1124 that is designed so that the transistor 1124 turns on in reverse conduction at a higher drain voltage (Vds closer to 0 V) as compared to the low-side transistor 124. In an embodiment, the higher voltage for reverse conduction can be achieved by reducing the spacing between the drain electrode and the gate electrode. In embodiments as illustrated, a drain electrode 1222 can be moved closer to the gate electrode 1224 as illustrated in FIG. 12, or the gate electrode 1324 can be moved farther from the source electrode 226 as illustrated in FIG. 13. In a particular example, reverse conduction for the transistor 1124 can occur when Vds is approximately −1 V, whereas reverse conduction may occur at −2 V when Vgs of the low-side transistor 124 is 0 V and Vth is 2 V, or −7 V when Vgs is −5 V and Vth is 2 V.

FIGS. 9 to 13 include a transistor 124 and another component, where the other component can be the diode 924 or another transistor 1124 with its source and gate shorted. The diode 924 and other transistor 1124 may be implemented in the form of a transistor structure. In an embodiment, transistor structures for the transistor 124 and the other component may be spaced apart from one another, and in another embodiment, transistor structures for the transistor 124 and the other component may be integrated so that the transistor structures share a common source electrode and a common drain electrode. On a relative basis, a channel width of the transistor structures that form the diode 924 or the transistor 1124 may be at most 50%, at most 20%, or at most 9% of the channel width of the transistor structures that form the transistor 124.

The transistor structure for the transistor 124 in FIGS. 9 to 13 has been described with respect to the transistor structure in FIG. 2. In another embodiment, any of the transistor structures as described with respect to FIGS. 2 to 8 may be used for the transistor 124.

Although the transistor and its structure are described with respect to a low-side transistor of a switching circuit, the transistor and its structure are not limited to switching circuits. The concepts as described herein are useful with an enhancement-mode transistor that has a 2DEG, such as a HEMT. More details and alternatives for the transistor structure can be found in U.S. application Ser. No. 15/893, 328 filed Feb. 9, 2018, which is incorporated herein in its entirety.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device including an enhancement-mode high electron mobility transistor can include a source electrode; a drain electrode; and a gate corresponding to a first set of spaced-apart gate electrodes and a first space disposed between the spaced-apart gate electrodes, wherein the first space has a width configured such that a continuous depletion region forms across all of the width of the first space.

Embodiment 2

The electronic device of Embodiment 1, further including a high-side transistor, wherein a source electrode of the high-side transistor is coupled to the drain electrode of the enhancement-mode high electron mobility transistor.

Embodiment 3

The electronic device of Embodiment 1, wherein, the continuous depletion region separates a drain-side two-dimension electron gas from a source-side two dimension electron gas.

Embodiment 4

The electronic device of Embodiment 1, wherein at least one gate electrode within the first set of spaced-apart gate electrodes has a tapered or rounded corner.

Embodiment 5

The electronic device of Embodiment 4, wherein the tapered or rounded corner faces the drain electrode.

Embodiment 6

The electronic device of Embodiment 1, wherein the gate further includes a second set of spaced-apart gate electrodes, wherein the first set of spaced-apart gate electrodes are oriented along a first line, and the second set of spaced-apart gate electrodes are oriented along a second line that is substantially parallel to and spaced apart from the first line.

Embodiment 7

The electronic device of Embodiment 6, wherein at least one gate electrode within the second set of spaced-apart gate electrodes has a tapered or rounded corner.

Embodiment 8

The electronic device of Embodiment 7, wherein none of the gate electrodes within the first set of spaced-apart gate electrodes has a tapered or rounded corner.

Embodiment 9

The electronic device of Embodiment 7, wherein the tapered or rounded corner faces the drain electrode.

Embodiment 10

The electronic device of Embodiment 1, wherein the enhancement-mode high electron mobility transistor further includes a channel layer that includes GaN; a barrier layer that includes $Al_xGa_{(1-x)}N$, wherein $0.05 \leq x \leq 0.3$; and the spaced-apart gate electrodes include p-type GaN.

Embodiment 11

An electronic device including an enhancement-mode high electron mobility transistor can include a source electrode; a drain electrode; and a gate electrode having a nonuniform thickness along a line in a width direction.

Embodiment 12

The electronic device of Embodiment 11, wherein along the line, a minimum thickness of the gate electrode is at most 80% of a maximum thickness of the gate electrode, and the minimum thickness is spaced apart from opposing ends of the gate electrode.

Embodiment 13

A method of using an electronic device can include providing an enhancement-mode high electron mobility transistor that includes a drain electrode and a source electrode; and during a transient period when the enhancement-mode high electron mobility transistor is in an off-state, flowing current from the drain electrode to the source electrode when $Vds > -Vth + Vgs$, where Vds is a drain-to-source voltage, Vth is a threshold voltage of the enhancement-mode high electron mobility transistor, and Vgs is a gate-to-source voltage.

Embodiment 14

The method of Embodiment 13, wherein Vgs is in a range of −0.1 V to +0.1 V.

Embodiment 15

The method of Embodiment 13, wherein Vgs is lower than −2 V.

Embodiment 16

The method of Embodiment 13, further including providing a high-side transistor, wherein a source electrode of the high-side transistor is coupled to the drain electrode of the enhancement-mode high electron mobility transistor.

Embodiment 17

The method of Embodiment 16, further including turning off the high-side transistor before flowing current from the drain electrode to the source electrode of the enhancement-mode high electron mobility transistor.

Embodiment 18

The method of Embodiment 16, wherein providing the enhancement-mode high electron mobility transistor includes providing the enhancement-mode high electron mobility transistor that includes spaced-apart gate electrodes and a space between the gate electrodes; and when the enhancement-mode high electron mobility transistor is at steady state in the off-state, a depletion region associated with the spaced-apart gate electrodes is continuous across all of a width of the space.

Embodiment 19

The method of Embodiment 18, wherein during a transient period, when the enhancement-mode high electron mobility transistor is in the off-state, a depletion region becomes discontinuous at the space between the spaced-apart gate electrodes of the enhancement-mode high electron mobility transistor.

Embodiment 20

The method of Embodiment 19, wherein the transient period is between turning off the high-side transistor and reaching the steady state when the enhancement-mode high electron mobility transistor is in the off-state.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device including an enhancement-mode high electron mobility transistor comprising:
    a channel layer;
    a barrier layer overlying the channel layer;
    a source electrode;
    a drain electrode; and
    a gate corresponding to a first set of spaced-apart gate electrodes and a first space disposed between the spaced-apart gate electrodes, wherein:
        the first set of spaced-apart gate electrodes and the first space are oriented along a first line in a width direction of the enhancement-mode high electron mobility transistor,
        the first set of spaced-apart gate electrodes covers first portions of each of the channel layer and the barrier layer,
        the first space covers a second portion of each of the channel layer and the barrier layer,
        the first space has a width configured such that a continuous depletion region forms across all of the width of the first space.

2. The electronic device of claim 1, further comprising a high-side transistor, wherein a source electrode of the high-side transistor is coupled to the drain electrode of the enhancement-mode high electron mobility transistor.

3. The electronic device of claim 1, wherein the continuous depletion region separates a drain-side two-dimension electron gas from a source-side two dimension electron gas.

4. The electronic device of claim 1, wherein at least one gate electrode within the first set of spaced-apart gate electrodes has a tapered or rounded corner.

5. The electronic device of claim 4, wherein the tapered or rounded corner faces the drain electrode.

6. The electronic device of claim 1, wherein the gate further comprises a second set of spaced-apart gate electrodes, wherein the second set of spaced-apart gate electrodes are oriented along a second line that is substantially parallel to and spaced apart from the first line.

7. The electronic device of claim 6, wherein at least one gate electrode within the second set of spaced-apart gate electrodes has a tapered or rounded corner.

8. The electronic device of claim 7, wherein none of the gate electrodes within the first set of spaced-apart gate electrodes has a tapered or rounded corner.

9. The electronic device of claim 7, wherein the tapered or rounded corner faces the drain electrode.

10. The electronic device of claim 1, wherein the enhancement-mode high electron mobility transistor further comprises:
    a channel layer that includes GaN;
    a barrier layer that includes $Al_xGa_{(1-x)}N$, wherein $0.05 \leq x \leq 0.3$; and
    the spaced-apart gate electrodes include p-type GaN.

11. A method of using an electronic device comprising:
    providing an enhancement-mode high electron mobility transistor that includes a drain electrode and a source electrode; and during a transient period when the enhancement-mode high electron mobility transistor is in an off-state, flowing current from the drain electrode to the source electrode when Vds>−Vth+Vgs, where Vds is a drain-to-source voltage, Vth is a threshold voltage of the enhancement-mode high electron mobility transistor, and Vgs is a 12 gate-to-source voltage.

12. The method of claim 11, wherein Vgs is in a range of −0.1 V to +0.1 V.

13. The method of claim 11, wherein Vgs is lower than −2 V.

14. The method of claim 11, further comprising providing a high-side transistor, wherein a source electrode of the high-side transistor is coupled to the drain electrode of the enhancement-mode high electron mobility transistor.

15. The method of claim 14, further comprising turning off the high-side transistor before flowing current from the drain electrode to the source electrode of the enhancement-mode high electron mobility transistor.

16. The method of claim 14, wherein:
providing the enhancement-mode high electron mobility transistor comprises providing the enhancement-mode high electron mobility transistor that includes spaced-apart gate electrodes and a space between the gate electrodes; and
when the enhancement-mode high electron mobility transistor is at steady state in the off-state, a depletion region associated with the spaced-apart gate electrodes is continuous across all of a width of the space.

17. The method of claim 16, wherein during a transient period, when the enhancement-mode high electron mobility transistor is in the off-state, a depletion region becomes discontinuous at the space between the spaced-apart gate electrodes of the enhancement-mode high electron mobility transistor.

18. The method of claim 17, wherein the transient period is between turning off the high-side transistor and reaching the steady state when the enhancement-mode high electron mobility transistor is in the off-state.

19. An electronic device including an enhancement-mode high electron mobility transistor comprising:
a source electrode;
a drain electrode; and
a gate corresponding to a first set of spaced-apart gate electrodes and a second set of spaced-apart gate electrodes,
wherein:
a first space is disposed between the spaced-apart gate electrodes within the first set of spaced-apart gate electrodes,
the first space has a width configured such that a continuous depletion region forms across all of the width of the first space,
the first set of spaced-apart gate electrodes are oriented along a first line,
the second set of spaced-apart gate electrodes are oriented along a second line that is substantially parallel to and spaced apart from the first line,
at least one gate electrode within the second set of spaced-apart gate electrodes has a tapered or rounded corner, and
none of the gate electrodes within the first set of spaced-apart gate electrodes has a tapered or rounded corner.

20. The electronic device of claim 19, wherein the tapered or rounded corner faces the drain electrode.

\* \* \* \* \*